(12) United States Patent
Hirano et al.

(10) Patent No.: US 11,107,961 B2
(45) Date of Patent: Aug. 31, 2021

(54) ULTRAVIOLET LIGHT-EMITTING DEVICE, METHOD FOR MANUFACTURING ULTRAVIOLET LIGHT-EMITTING DEVICE AND METHOD FOR MANUFACTURING ULTRAVIOLET LIGHT-EMITTING MODULE

(71) Applicants: Soko Kagaku Co., Ltd., Ishikawa (JP); AGC INC., Tokyo (JP)

(72) Inventors: Akira Hirano, Aichi (JP); Yosuke Nagasawa, Nara (JP); Masamichi Ippommatsu, Hyogo (JP); Ko Aosaki, Tokyo (JP); Yuki Suehara, Tokyo (JP); Yoshihiko Sakane, Tokyo (JP)

(73) Assignees: SOKO KAGAKU CO., LTD., Ishikawa (JP); AGC INC., Tokyo (JP)

( * ) Notice: Subject to any disclaimer, the term of this patent is extended or adjusted under 35 U.S.C. 154(b) by 14 days.

(21) Appl. No.: 16/753,714

(22) PCT Filed: Nov. 2, 2017

(86) PCT No.: PCT/JP2017/039692
§ 371 (c)(1),
(2) Date: Apr. 3, 2020

(87) PCT Pub. No.: WO2019/087348
PCT Pub. Date: May 9, 2019

(65) Prior Publication Data
US 2020/0274040 A1      Aug. 27, 2020

(51) Int. Cl.
*H01L 33/58*      (2010.01)
*H01L 33/00*      (2010.01)
(Continued)

(52) U.S. Cl.
CPC .......... *H01L 33/58* (2013.01); *H01L 33/0075* (2013.01); *H01L 33/32* (2013.01);
(Continued)

(58) Field of Classification Search
CPC ..... H01L 33/58; H01L 33/0075; H01L 33/32; H01L 33/56; H01L 33/62; H01L 2933/005; H01L 2933/0058
(Continued)

(56) References Cited

U.S. PATENT DOCUMENTS

2003/0173599 A1*   9/2003   Nakai .............. H01L 27/14627
                                                          257/225
2003/0230977 A1    12/2003  Epstein
(Continued)

FOREIGN PATENT DOCUMENTS

JP     01-147501     6/1989
JP     04-189880     7/1992
(Continued)

*Primary Examiner* — Igwe U Anya
(74) *Attorney, Agent, or Firm* — Haynes Beffel & Wolfeld LLP

(57) ABSTRACT

The ultraviolet light-emitting device includes a base, a nitride semiconductor ultraviolet light-emitting element flip-chip mounted on the base, and a lens for sealing a nitride semiconductor ultraviolet light-emitting element to focus or diffuse light emitted from the nitride semiconductor ultraviolet light-emitting device. The lens is composed of an amorphous fluororesin in which a structural unit of a polymer or copolymer has a fluorine-containing aliphatic cyclic structure and a terminal functional group is a perfluoroalkyl group, and a density of the amorphous fluororesin is higher than 2.11 g/cm$^3$.

7 Claims, 11 Drawing Sheets

(51) Int. Cl.
*H01L 33/32* (2010.01)
*H01L 33/56* (2010.01)
*H01L 33/62* (2010.01)

(52) U.S. Cl.
CPC .............. *H01L 33/56* (2013.01); *H01L 33/62* (2013.01); *H01L 2933/005* (2013.01); *H01L 2933/0058* (2013.01)

(58) Field of Classification Search
USPC .......................................................... 257/98
See application file for complete search history.

(56) References Cited

U.S. PATENT DOCUMENTS

| | | |
|---|---|---|
| 2005/0006651 A1 | 1/2005 | LeBoeuf et al. |
| 2006/0138443 A1 | 6/2006 | Fan et al. |
| 2007/0267645 A1* | 11/2007 | Nakata .................... H01L 33/58 257/98 |
| 2015/0243856 A1 | 8/2015 | Yamada et al. |
| 2016/0027970 A1 | 1/2016 | Shatalov et al. |
| 2016/0218259 A1 | 7/2016 | Yamada et al. |
| 2018/0190877 A1* | 7/2018 | Hirano .................. H01L 33/382 |
| 2018/0277723 A1* | 9/2018 | Hirano .................... H01L 33/20 |

FOREIGN PATENT DOCUMENTS

| | | |
|---|---|---|
| JP | 2004023099 A | 1/2004 |
| JP | 2017120837 A | 7/2017 |
| WO | 2014178288 A1 | 11/2014 |
| WO | 2015037608 A1 | 3/2015 |
| WO | 2017072859 A1 | 5/2017 |

\* cited by examiner

ULTRAVIOLET LIGHT-EMITTING DEVICE, METHOD FOR MANUFACTURING ULTRAVIOLET LIGHT-EMITTING DEVICE AND METHOD FOR MANUFACTURING ULTRAVIOLET LIGHT-EMITTING MODULE

TECHNICAL FIELD

The present invention relates to an ultraviolet light-emitting device including a nitride semiconductor ultraviolet light-emitting element flip-chip mounted on a base, and more particularly, to an ultraviolet light-emitting device including a nitride semiconductor ultraviolet light-emitting element emitting light having an emission center wavelength of 200 nm or more and 365 nm or less (ultraviolet light).

BACKGROUND ART

Conventionally, as a nitride semiconductor ultraviolet light-emitting element such as a light emitting diode or a semiconductor laser, a light-emitting element structure including a plurality of nitride semiconductor layers epitaxially grown on a main surface of a substrate such as sapphire has been known. The nitride semiconductor layer is represented by the general formula $Al_{1-x-y}Ga_xIn_yN$ ($0 \leq x \leq 1$, $0 \leq y \leq 1$, and $0 \leq x+y \leq 1$).

As an ultraviolet light-emitting device on which a nitride semiconductor ultraviolet light-emitting element is mounted, an ultraviolet light-emitting device is known in which a nitride semiconductor ultraviolet light-emitting element is flip-chip mounted and light generated in a nitride semiconductor layer is extracted from the rear surface (a surface on the side opposite to the main surface) of a substrate (for example, see Patent Documents 1 and 2 below). In addition, among such ultraviolet light-emitting devices, there is an ultraviolet light-emitting device in which a lens is provided on the rear surface side of a substrate in a nitride semiconductor ultraviolet light-emitting element flip-chip mounted (for example, see FIG. 1 of Patent Document 1 below).

PRIOR ART DOCUMENTS

Patent Document

Patent Document 1: WO2014/178288
Patent Document 2: JP-A-2017-120837

SUMMARY OF THE INVENTION

Problems to be Solved by the Invention

In Patent Document 1, it is described that a lens may be formed by sealing a nitride semiconductor ultraviolet light-emitting element with an amorphous fluororesin and forming the surface of amorphous fluororesin into a spherical surface. It is also described that non-bonding amorphous fluororesin, in which the structural units constituting the polymer or copolymer have a fluorine-containing aliphatic cyclic structure and the terminal functional group is a perfluoroalkyl group, may be used as amorphous fluororesin. Such an amorphous fluororesin is hardly deteriorated even when exposed to ultraviolet rays, and transmits ultraviolet rays well (for example, the transmittance of ultraviolet rays is 90% or more), and is suitable for sealing nitride semiconductor ultraviolet light-emitting element.

However, amorphous fluororesin has a low refractive index and low lens performance compared to silicone resins widely used in the past. For example, in Patent Document 2, it is reported that the refractive index of a silicone resin is about 1.4 while the refractive index of an amorphous fluororesin is about 1.35 when nitride semiconductor ultraviolet light-emitting element having a peak emission wavelength of 265 nm is sealed (see paragraphs [0019] and [0053] of Patent Document 2).

Although the difference between the two seems to be slight, the refractive index has a very large effect on lens performance. For example, when the light extraction efficiency of the unsealed nitride semiconductor ultraviolet light-emitting element is 100%, even if the light extraction efficiency can be increased to 198% by sealing the nitride semiconductor ultraviolet light-emitting device with a silicone resin having a hemispherical outer shape, when the nitride semiconductor ultraviolet light-emitting device is sealed with an amorphous fluororesin having the same size and the same shape as the silicone resin, the light extraction efficiency can be increased to only 150%.

However, since silicone resins rapidly deteriorate when exposed to UV light and light of peripheral wavelengths, the silicone resins cannot be used in ultraviolet light-emitting devices which are actually shipped as products. Therefore, in the ultraviolet light-emitting devices which are actually shipped as products, it is necessary to use an amorphous fluororesin which has a smaller refractive index than that of a silicone resin and is inferior in lens performance, but is hardly deteriorated even when the resin is exposed to ultraviolet rays and light of peripheral wavelengths.

The present invention has been made in view of the above-mentioned problems, and an object of the present invention is to provide an ultraviolet light-emitting device in which a nitride semiconductor ultraviolet light-emitting element is sealed by a lens composed of an amorphous fluororesin having improved lens performance.

Means for Solving the Problem

In order to achieve the above object, the present invention provides an ultraviolet light-emitting device comprising: a base; a nitride semiconductor ultraviolet light-emitting element flip-chip mounted on the base; and a lens that seals the nitride semiconductor ultraviolet light-emitting element and focuses or diffuses light emitted from the nitride semiconductor ultraviolet light-emitting device, wherein the lens is composed of an amorphous fluororesin in which a structural unit of a polymer or copolymer has a fluorine-containing aliphatic cyclic structure and a terminal functional group is a perfluoroalkyl group, and a density of the amorphous fluororesin is larger than 2.11 g/cm$^3$.

According to this ultraviolet light-emitting device, it is possible to seal a nitride semiconductor ultraviolet light-emitting element with a lens made of an amorphous fluororesin having a refractive index closer to that of silicone resin than that of an amorphous fluororesin in standard condition. That is, the nitride semiconductor ultraviolet light-emitting element can be sealed with a lens composed of an amorphous fluororesin that is closer to lens performance of a silicone resin than the amorphous fluororesin in standard condition. Note that the amorphous fluororesin in standard condition is an amorphous fluororesin in which the density is not adjusted and is 2.030 g/cm$^3$ at room temperature (23° C.).

In the present invention, the AlGaN based semiconductor is a group III nitride semiconductor based on a ternary (or binary) workpiece represented by the general formula $Al_xGa_{1-x}N$ (x is an AlN molar fraction, $0 \leq x \leq 1$), whose band gap energy is GaN (x=0) band gap energy (about 3.4 eV) or more, and includes the case where a trace amount of In, P, As, or the like is contained as long as the condition regarding the band gap energy is satisfied.

In the ultraviolet light-emitting device of the above feature, the density of amorphous fluororesin constituting the lens may be greater than 2.21 g/cm³.

According to this ultraviolet light-emitting device, the nitride semiconductor ultraviolet light-emitting element can be sealed with a lens made of an amorphous fluororesin having a refractive index higher than that of a silicone resin. That is, the nitride semiconductor ultraviolet light-emitting element can be sealed with a lens composed of an amorphous fluororesin having better lens performance than a silicone resin.

In the ultraviolet light-emitting device of the above feature, a part of a surface of the lens may be a spherical surface or a convex curved surface. In the ultraviolet light-emitting device of the above feature, the emission center wavelength of the nitride semiconductor ultraviolet light-emitting element may be 200 nm or more and 365 nm or less.

The present invention also provides a method for manufacturing an ultraviolet light-emitting device, the method comprising: a first step of sealing a nitride semiconductor ultraviolet light-emitting element flip-chip mounted on a base to form a lens for focusing or diffusing light emitted from the nitride semiconductor ultraviolet light-emitting element; wherein the lens is formed of an amorphous fluororesin in which a structural unit of a polymer or copolymer has a fluorine-containing aliphatic cyclic structure and a terminal functional group is a perfluoroalkyl group; and, in the first step or a subsequent step, the amorphous fluororesin constituting the lens is heated to a glass transition temperature or higher, a pressure of 35 MPa or higher is applied to the amorphous fluororesin, and the lens is cooled to a temperature lower than the glass-transition temperature by 30° C. or more while the pressure is applied, thereby densifying the amorphous fluororesin.

According to this method for manufacturing an ultraviolet light-emitting device, it is possible to obtain an ultraviolet light-emitting device in which a nitride semiconductor ultraviolet light-emitting element is sealed with a lens composed of an amorphous fluororesin having a refractive index closer to that of a silicone resin than that of an amorphous fluororesin in standard condition. That is, it is possible to obtain an ultraviolet light-emitting device in which nitride semiconductor ultraviolet light-emitting element is sealed with an amorphous fluororesin having a lens performance closer to that of a silicone resin than that of an amorphous fluororesin in standard condition.

Further, in the method for manufacturing an ultraviolet light-emitting device of the above feature, the method may further comprises simultaneously forming the lens for sealing each of a plurality of nitride semiconductor ultraviolet light-emitting elements flip-chip mounted on a base plate in which a plurality of bases are integrated in the first step, and a second step of dividing the base plate so that one or more of the nitride semiconductor ultraviolet light-emitting element sealed by the lens are included after densifying the amorphous fluororesin constituting the lens.

According to this method for manufacturing an ultraviolet light-emitting device, since the amorphous fluororesin in a plurality of ultraviolet light-emitting devices is formed at the same time, the ultraviolet light-emitting device can be efficiently manufactured.

The present invention further provides a method for manufacturing an ultraviolet light-emitting module, the method comprising: a third step of mounting one or more of ultraviolet light-emitting device having a nitride semiconductor ultraviolet light-emitting element flip-chip mounted on a base and sealed by a lens on a mounting member; and a fourth step of densifying the amorphous fluororesin after the third step, wherein the lens is formed of an amorphous fluororesin in which a structural unit of a polymer or copolymer has a fluorine-containing aliphatic cyclic structure and a terminal functional group is a perfluoroalkyl group; and in the fourth step, the amorphous fluororesin constituting the lens is heated to a glass-transition temperature or higher, a pressure of 35 MPa or higher is applied to the amorphous fluororesin, and the lens is cooled to a temperature lower than the glass-transition temperature by 30° C. or more while the pressure is applied.

According to this method for manufacturing an ultraviolet light-emitting module, it is possible to obtain an ultraviolet light-emitting module in which a nitride semiconductor ultraviolet light-emitting element is sealed with an amorphous fluororesin having a refractive index closer to that of a silicone resin than that of an amorphous fluororesin in standard condition. That is, it is possible to obtain an ultraviolet light-emitting module in which nitride semiconductor ultraviolet light-emitting element is sealed with an amorphous fluororesin having a lens performance closer to that of the silicone resin than that of the amorphous fluororesin in standard condition.

Further, according to this method for manufacturing an ultraviolet light-emitting module, the densification process of the amorphous fluororesin is performed after ultraviolet light-emitting device is mounted. This allows a high temperature processing (i.e., processing at or above the glass-transition temperature of an amorphous fluororesin, which would restore the density of the amorphous fluororesin if it had been densified) to be performed until ultraviolet light-emitting device has been mounted. For example, solder reflow can be performed when ultraviolet light-emitting device is mounted.

Effect of the Invention

According to the ultraviolet light-emitting device having the above feature, it is possible to seal a nitride semiconductor ultraviolet light-emitting element with a lens composed of an amorphous fluororesin whose lens performance is improved to be closer to the lens performance of a silicone resin than that of an amorphous fluororesin in standard condition.

Generally, a method of increasing a refractive index of a resin by changing the molecular structure such as adding a benzene ring or adding an inorganic material is known. However, when a nitride semiconductor ultraviolet light-emitting element is sealed with an amorphous fluororesin, if the molecular structure of the amorphous fluororesin is changed, the absorption wavelength of light is lengthened and the absorption amount of UV light is increased, so that the light extraction efficiency is lowered. In addition, in an amorphous fluororesin where the terminal functional group is a perfluoroalkyl group, since the affinity with an additive such as an inorganic material is low, the additive is not uniformly dispersed and the light transmittance is decreased, so that the light extraction efficiency is lowered. On the other hand, in the case of a method of increasing the refractive index by increasing the density, the molecular structure is not changed and an additive is not used, so that it is possible to prevent a decrease in the light extraction efficiency. Therefore, by sealing a nitride semiconductor ultraviolet light-emitting element with a lens composed of an amorphous fluororesin whose refractive index is increased by increasing the density, it is possible to improve the lens performance while suppressing a decrease in the light extraction efficiency.

DESCRIPTION OF EMBODIMENT

Figure 1:
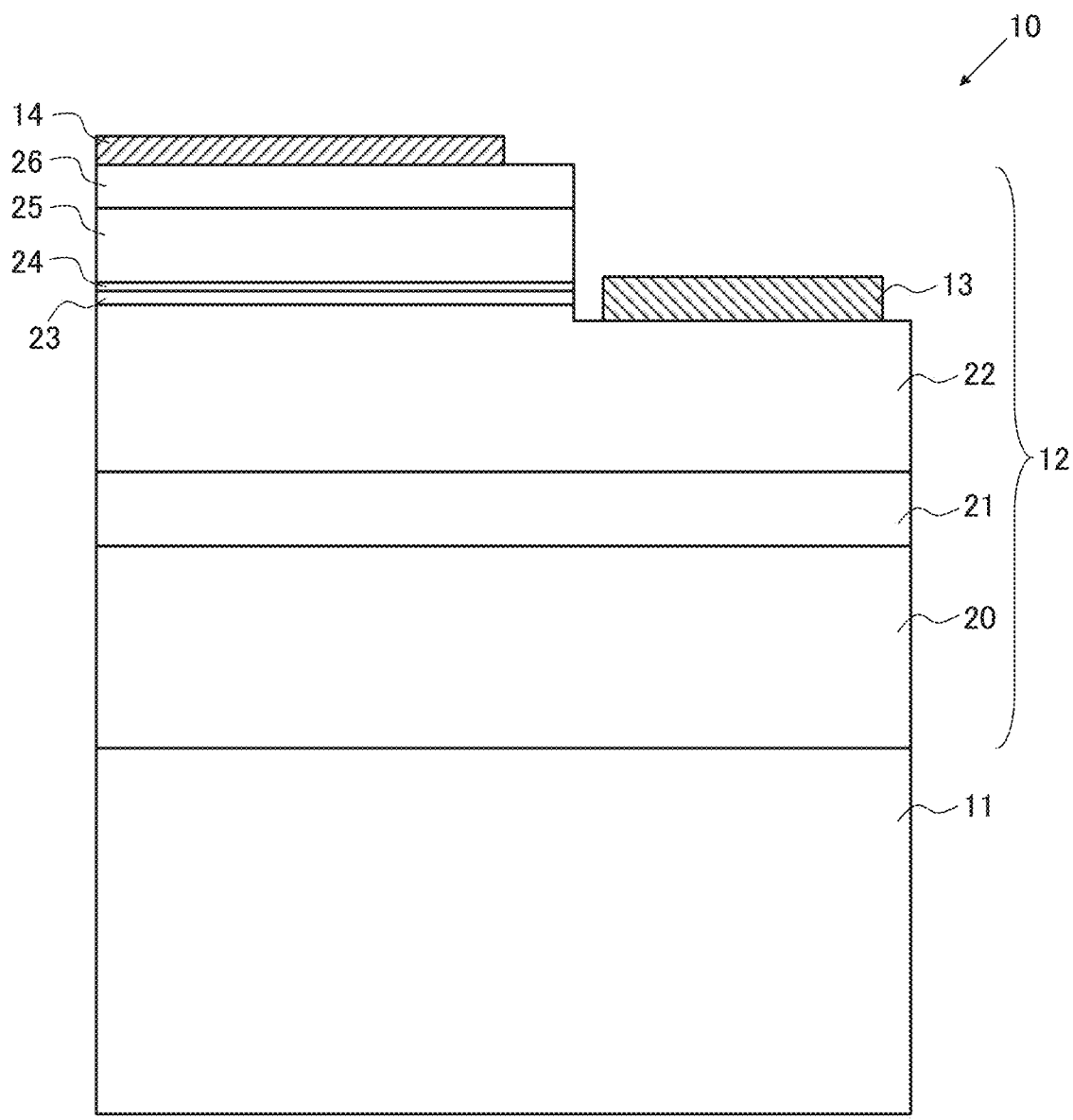
FIG. 1 is a cross-sectional view schematically showing an example of an element structure of a nitride semiconductor ultraviolet light-emitting element included in an ultraviolet light-emitting device according to an embodiment of the present invention.

Hereinafter, an ultraviolet light-emitting device according to an embodiment of the present invention will be described with reference to the drawings. In the drawings referred to in the following description, in order to facilitate understanding of the description, a main part is emphasized in some parts and schematically shown, and therefore, the dimensional ratio of each part is not necessarily the same as that of an actual element and a part used. In the following description, a case where the nitride semiconductor ultraviolet light-emitting element included in the ultraviolet light-emitting device according to the embodiment of the present invention is a light emitting diode will be described as an example.

Nitride Semiconductor Ultraviolet Light-Emitting Element

Figure 2:
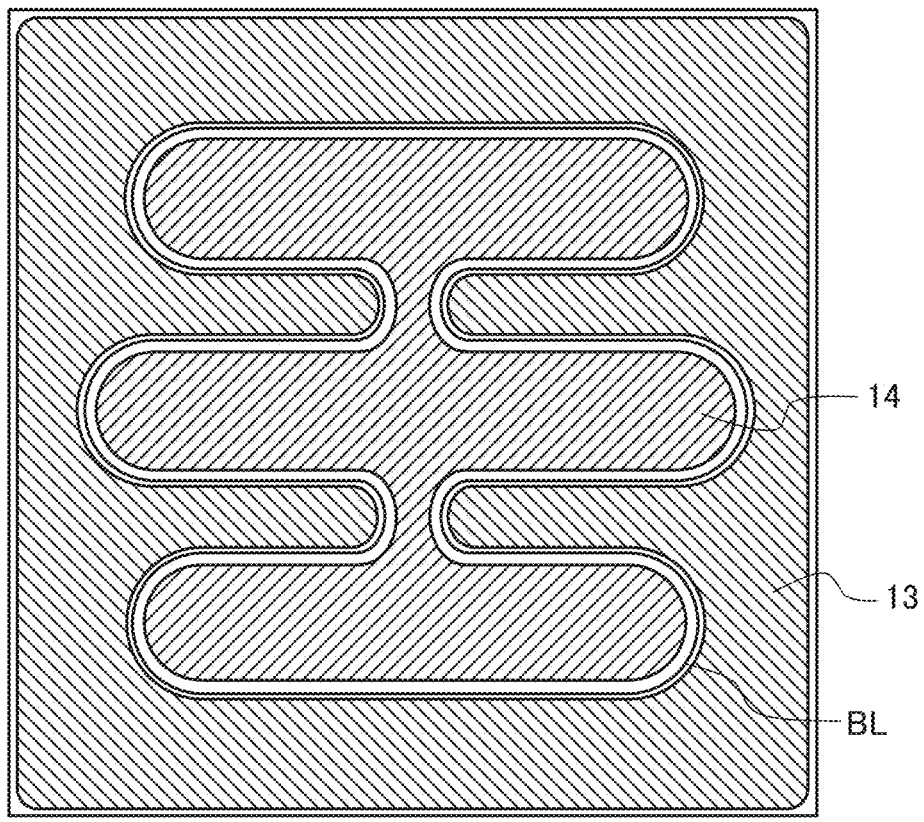
FIG. 2 is a plan view schematically showing a planarly-viewed shape of the nitride semiconductor ultraviolet light-emitting element shown in FIG. 1.

First, an example of a nitride semiconductor ultraviolet light-emitting element included in an ultraviolet light-emitting device according to an embodiment of the present invention will be described with reference to the drawings. FIG. 1 is a cross-sectional view schematically showing an example of an element structure of a nitride semiconductor ultraviolet light-emitting element included in an ultraviolet light-emitting device according to an embodiment of the present invention, and FIG. 2 is a plan view schematically showing a planarly-viewed shape of the nitride semiconductor ultraviolet light-emitting element shown in FIG. 1.

Figure 3:
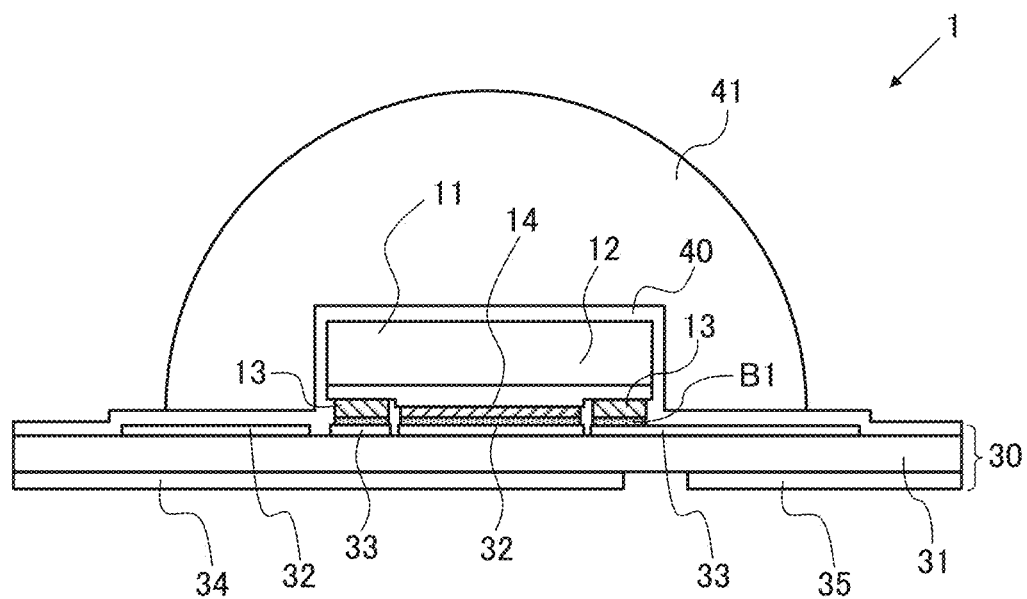
FIG. 3 is a cross-sectional view schematically showing an example of the ultraviolet light-emitting device according to the embodiment of the present invention.

As shown in FIG. 1, a nitride semiconductor ultraviolet light-emitting element 10 included in an ultraviolet light-emitting device according to an embodiment of the present invention includes, on a main surface of a sapphire substrate 11, a semiconductor laminated portion 12 including a plurality of AlGaN based semiconductor layers, an n-electrode 13, and a p-electrode 14. It is assumed in advance that the nitride semiconductor ultraviolet light-emitting element 10 is flip-chip mounted as shown in FIG. 3 described later, and light emitted from the semiconductor laminated portion 12 is taken out to the outside from the rear surface side of the sapphire substrate 11.

For example, the semiconductor laminated portion 12 includes an AlN layer 20, an AlGaN layer 21, an n-type cladding layer 22 made of n-type AlGaN, an active layer 23, a p-type AlGaN electron blocking layer 24, a p-type cladding layer 25 made of p-type AlGaN, and a p-type contact layer 26 made of p-type GaN stacked in order from the sapphire substrate 11. A light emitting diode structure is formed from the n-type cladding layer 22 to the p-type contact layer 26. The sapphire substrate 11, the AlN layer 20, and the AlGaN layer 21 function as a template to form light emitting diode structures thereon. The active layer 23, the electron blocking layer 24, the p-type cladding layer 25, and a part of the p-type contact layer 26 above the n-type cladding layer 22 are removed by reactive ion etching or the like until a part of the surface of the n-type cladding layer 22 is exposed. The semiconductor layers from the active layer 23 to the p-type contact layer 26 above the exposed surface of the n-type cladding layer 22 after the removal are referred to as a "mesa portion" for convenience. The active layer 23 has, for example, a single-layer quantum-well structure composed of an n-type AlGaN barrier layer and an AlGaN or GaN well layer. The active layer 23 may be a double heterojunction structure sandwiched between n-type and p-type AlGaN layers having a large AlN molar fraction in the lower layer and the upper layer, or may be a multiple quantum well structure in which the above single layer quantum well structure is multilayered.

The AlGaN layers are formed by a well-known epitaxial growth method such as a metal-organic vapor phase epitaxy (MOVPE) method or a molecular beam epitaxy (MBE) method, and Si, for example, is used as the donor impurity of the n-type layer, and Mg, for example, is used as the acceptor impurity of the p-type layer.

An n-electrode 13 composed of Ti/Al/Ti/Au, for example, is formed on the exposed surfaces of the n-type cladding layer 22. A p-electrode 14 composed of Ni/Au, for example, is formed on the surfaces of the p-type contact layer 26. Note that the number of layers and materials of the metal layers constituting the n-electrode 13 and the p-electrode 14 are not limited to the number of layers and materials exemplified above.

Further, as shown in FIG. 2, a planarly-viewed chip shape of the nitride semiconductor ultraviolet light-emitting element 10 is square, and the surface of the n-type cladding layer 22 is exposed in the outer peripheral portion of the chip so as to surround the mesa portion of a planarly-viewed comb shape located in the center. Further, a configuration example is assumed in which the n-electrode 13 is formed annularly on the exposed surface of the n-type cladding layer 22 so as to surround the mesa portion, and the p-electrode 14 is formed on top of the mesa portion. In FIG. 2, the hatched portions are the n-electrode 13 and the p-electrode 14, respectively. The boundary line BL between the mesa portion and the exposed surface of the n-type cladding layer 22 is shown for reference.

In the nitride semiconductor ultraviolet light-emitting device 10 of the present embodiment, as shown in FIG. 2, the exposed area of the n-electrode 13 is widened at four corners of the chip, and in flip-chip mounting, a configuration example is assumed in which the n-electrode 13 is physically and electrically coupled with corresponding electrode pads on the submount via bonding materials at the four corners. Note that the planarly-viewed chip shape of the nitride semiconductor ultraviolet light-emitting device 10, the planarly-viewed shape of the mesa portion, the number of n electrodes 13 and p electrodes 14, and the formation position thereof are not limited to the shape, the number, and the formation position illustrated in FIG. 2. In the nitride semiconductor ultraviolet light-emitting element of the present example, the chip size is assumed to be about 0.8 mm to 1.5 mm on one side, but the chip size is not limited to this range.

In the nitride semiconductor ultraviolet light-emitting element 10, the semiconductor laminated portion 12, the n-electrode 13, and the p-electrode 14 formed on the main surface of the sapphire substrate 11 are not limited to the configurations and structures exemplified above, and various known configurations and structures can be employed. In addition, the nitride semiconductor ultraviolet light-emitting element 10 may include components other than the semiconductor laminated portion 12, the n-electrode 13, and the p-electrode 14, for example, a protective film or the like. Therefore, detailed descriptions of the film thicknesses of the AlGaN layers 20 to 26 and the electrodes 13 and 14 are omitted.

As will be described later, the ultraviolet light-emitting device according to the embodiment of the present invention in a configuration that the nitride semiconductor ultraviolet light-emitting element 10 is flip-chip mounted on a base such as a submount and sealed with an amorphous fluororesin, is characterized in that the shape change of the amorphous fluororesin is prevented after the ultraviolet light-emitting device is shipped. Therefore, the semiconductor laminated portion 12, the n-electrode 13, and the p-electrode 14 formed on the main surface of the sapphire substrate 11 are not the gist of the present invention, and since various modifications are conceivable as specific element structures, and can be manufactured by a well-known manufacturing method, a detailed description of the manufacturing method of the nitride semiconductor ultraviolet light-emitting element 10 will be omitted.

Ultraviolet Light-Emitting Device

Figure 4A:
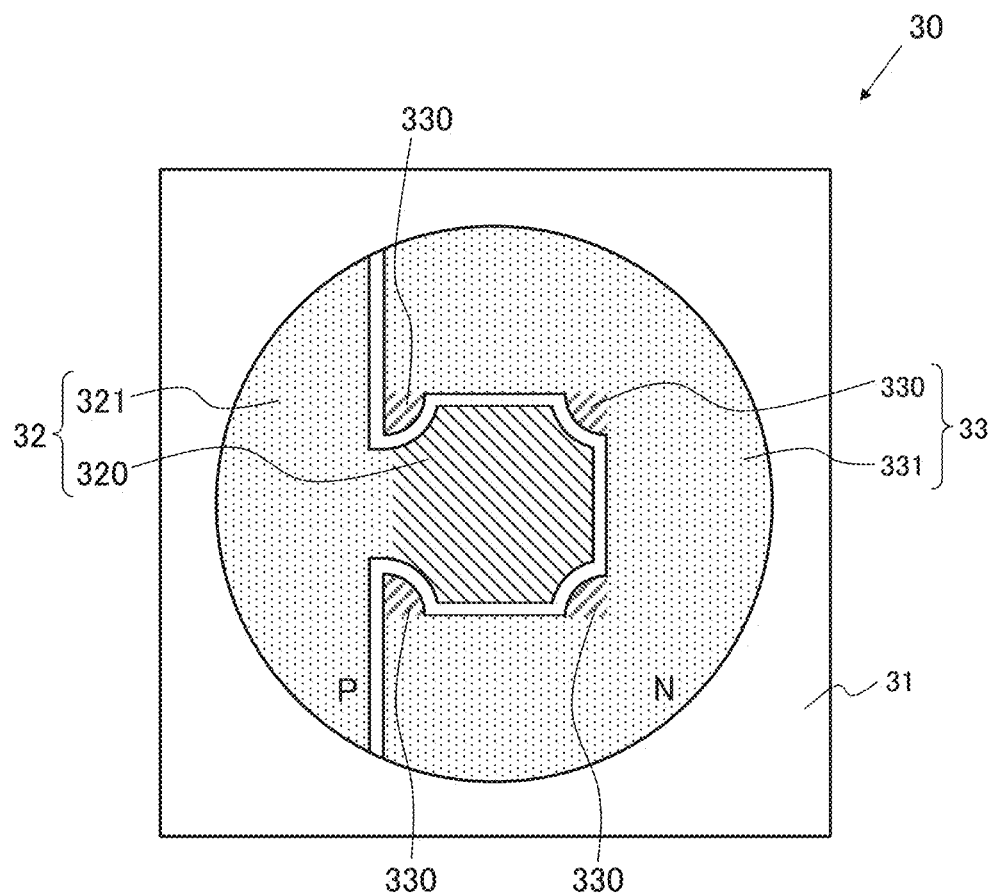
FIGS. 4A and 4B are a plan view and a cross-sectional view schematically showing a planarly-viewed shape and a cross-sectional shape of a submount used in the ultraviolet light-emitting device shown in FIG. 3.
Figure 4B:
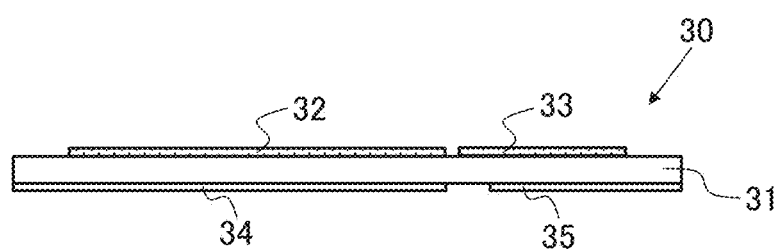

Next, an ultraviolet light-emitting device according to an embodiment of the present invention will be described with reference to FIGS. 3, 4A and 4B. FIG. 3 is a cross-sectional view schematically showing an example of the ultraviolet light-emitting device according to the embodiment of the present invention. FIGS. 4A and 4B are a plan view and a cross-sectional view schematically showing a planarly-viewed shape and a cross-sectional shape of a submount used in the ultraviolet light-emitting device shown in FIG. 3.

As shown in FIG. 3, the nitride semiconductor ultraviolet light-emitting element 10 is mounted (flip-chip mounted) on a submount 30 with the main surface side of the sapphire substrate 11 facing the submount 30. In the following description with reference to FIG. 3, the direction of the nitride semiconductor ultraviolet light-emitting element 10 side is defined as the upward direction with reference to the mounting surface of the submount 30.

FIG. 4A is a plan view showing the planarly-viewed shape of the submount 30, and FIG. 4B is a cross-sectional view showing the cross-sectional shape in a cross section perpendicular to the surface of the submount 30 passing through the center of the submount 30 in the plan view FIG. 4A. The length of one side of the submount 30 is not limited to a specific value as long as the nitride semiconductor ultraviolet light-emitting element 10 can be mounted and a sealing resin can be formed around it. As an example, the length of one side of the submount 30 having a planarly-viewed square shape is preferably, for example, about 1.5 to 2 times or more of the chip size (length of one side) of the nitride semiconductor ultraviolet light-emitting element 10 to be mounted in the same planarly-viewed square shape. It should be noted that the planarly-viewed shape of the submount 30 is not limited to a square.

The submount 30 includes a flat base material 31 made of an insulating material such as insulating ceramics, and the first metal electrode wiring 32 on the anode side and the second metal electrode wiring 33 on the cathode side are respectively formed on the front surface of the base material 31, and lead terminals 34 and 35 are formed on the rear surface of the base material 31. The first and second metallic electrode wirings 32 and 33 on the front surface of the base material 31 are respectively connected to the lead terminals 34 and 35 on the rear surface of the base material 31 via through electrodes (not shown) provided through the base material 31. When the submount 30 is mounted on another wiring board or the like, an electrical connection is formed between the metallic wiring on the wiring board and the lead terminals 34 and 35. The lead terminals 34 and 35 cover substantially the entire rear surface of the base material 31, and fulfill the functionality of a heat sink.

As shown in FIGS. 4A and 4B, the first and second metal electrode wirings 32 and 33 are formed at and around a place where the nitride semiconductor ultraviolet light-emitting element 10 is mounted in the central portion of the base material 31, and are arranged apart from each other and electrically separated from each other. The first metallic electrode wiring 32 includes first electrode pads 320 and first wiring portions 321 connected thereto. The second metallic electrode wiring 33 is composed of four second electrode pads 330 and a second wiring portion 331 connected thereto. The first electrode pad 320 has a planarly-viewed shape slightly larger than the outer frame of the comb-shaped planarly-viewed shape of the p-electrode 14 of the nitride semiconductor ultraviolet light-emitting element 10 (the outer circumference of the shape in which the mesa portion is also assumed to be present in the concave portion of the comb shape), and is located at the center of the central portion of the base material 31. The planarly-viewed shape, the number, and the arrangement of the second electrode pads 330 are set so that, when the nitride semiconductor ultraviolet light-emitting element 10 is arranged so that the p-electrode 14 of the nitride semiconductor ultraviolet light-emitting element 10 faces the first electrode pad 320, widened portions of the exposed area of the n-electrode 13 at the four corners face the second electrode pads 330, respectively. In FIG. 4A, the first electrode pad 320 and the second electrode pads 330 are hatched, respectively. Note that the planarly-viewed shape of the first and second metal electrode wirings 32 and 33 is not limited to the shape shown in FIG. 4A, and various modifications of the planarly-viewed shape are possible as long as the p-electrode 14 faces the first electrode pad 320 and the four corners of the n-electrode 13 face the second electrode pad 330.

The substrate 31 of the submount 30 is formed of an insulating material such as aluminum nitride (AlN) that does not deteriorate due to exposure to ultraviolet rays. Although AlN is preferable in terms of heat dissipation, the base material 31 may be silicon carbide (SiC), silicon nitride (SiN), boron nitride (BN), or a ceramic such as alumina ($Al_2O_3$) or the like. The base material 31 is not limited to the solid material of the insulating material, and may be a sintered body in which silica glass is used as a binder and particles of the insulating material are closely bonded, or may be a diamond-like carbon (DLC) thin film, an industrial diamond thin film, or the like.

In the case where the submount 30 does not have the lead terminals 34 and 35 on the rear surface of the base material 31, the base material 31 may have a laminated structure of a metal film (e.g., Cu, Al, or the like) and an insulating layer made of the above-mentioned insulating material, instead of being formed of an insulating material alone.

As an example, the first and second metal electrode wirings 32 and 33 are composed of a thick-film plated film of copper and a single or multilayer surface metal film covering the surface, i.e., the upper surface and the side wall surface, of the thick-film plated film. The outermost layer of the surface metal film is composed of a metal (for example, gold (Au) or a platinum group metal (Ru, Rh, Pd, Os, Ir, Pt, or an alloy of two or more of these) or an alloy of gold and a platinum group metal) which has a smaller ionization tendency than copper constituting the thick film plating film.

As shown in FIG. 3, the nitride semiconductor ultraviolet light-emitting device 10 is placed on and fixed to the central part of the base material 31 with the n-electrode 13 and the p-electrode 14 facing downward, as the p-electrode 14 and the first electrode pad 320, and the four corners of the n-electrode 13 and the four second electrode pads 330 are respectively facing each other and electrically and physically connected with each other via a bonding material B1 such as AuSn solder or gold bumps. When the bonding material B1 is composed of a solder material such as AuSn solder, the top surfaces of the p-electrode 14 and the n-electrode 13 (the bottom surfaces in FIG. 3) may be formed to be in the same plane with aligned heights, and the p-electrode 14 and the first metal electrode wiring 32, and the n-electrode 13 and the second metal electrode wiring 33 may be physically and electrically connected by a well-known soldering method such as solder reflow. Further, as a method of aligning the heights so that the top surfaces of the p-electrode 14 and the n-electrode 13 are in the same plane, for example, a method of forming a p-side plating electrode electrically connected the p-electrode 14 so as to cover the top surface (the bottom surface in FIG. 3) and the side surface of the mesa portion via an insulating protective film, and forming an n-side plating electrode which is separated from the p-side plating electrode and electrically connected to the n-electrode 13 at the same height as the p-side plating electrode by an electrolytic plating method or the like can be considered. For details of the plating electrode, reference is made to the specification of WO 2016/157518 and the like.

As shown in FIG. 3, the nitride semiconductor ultraviolet light-emitting element 10 mounted on submount 30 is sealed by a covering resin 40 and a lens 41. Specifically, the upper surface and the side surface of nitride semiconductor ultraviolet light-emitting element 10 and the upper surface of the submount 30 (the upper surface and the side surface of the first and second metal electrode wirings 32 and 33 and the surface of the base material 31 exposed between the first and second metal electrode wirings 32 and 33) are covered with the covering resin 40, and the gap between the submount 30 and nitride semiconductor ultraviolet light-emitting element 10 is filled with the covering resin 40. A lens 41 is provided so as to cover and seal the rear surface and the side surface of the nitride semiconductor ultraviolet light-emitting element 10 on which the covering resin 40 is formed. The lens 41 has a lens shape that focuses or diffuses at least the light emitted from nitride semiconductor ultraviolet light-emitting element 10, and the shape thereof is appropriately designed according to the object of the ultraviolet light-emitting device 1.

The covering resin 40 and the lens 41 are made of an amorphous fluororesin having excellent heat resistance, ultraviolet ray resistance, and ultraviolet ray transmittance. Amorphous fluororesin includes an amorphized polymer alloy obtained by copolymerizing a fluororesin of a crystalline polymer, a copolymer of perfluorodioxole (trade name of Teflon AF (registered trademark) manufactured by DuPont) and a cyclized polymer of perfluoro butenyl vinyl ether (trade name of Cytop (registered trademark) manufactured by AGC Inc.).

Amorphous fluororesins are roughly classified into a bonding amorphous fluororesin having a reactive terminal functional group exhibiting a metal-bonding property and a non-bonding amorphous fluororesin having no reactive terminal functional group. The reactive terminal functional group is, by way of example, a carboxyl group (COOH) or an ester group (COOR). Where R represents an alkyl group.

If the covering resin 40 formed around the electrodes is made of a non-bonding amorphous fluororesin which does not have a reactive terminal functional group which may cause migration of metals constituting the electrodes, short-circuiting due to the migration can be prevented. Specifically, the covering resin 40 is composed of the non-bonding amorphous fluororesin in which a structural unit constituting a polymer or copolymer has a fluorine-containing aliphatic cyclic structure and a terminal functional group is a perfluoroalkyl group such as $CF_3$ which exhibits non-bonding property to metals or the like. In ultraviolet light-emitting device 1 according to the embodiment of the present invention, the lens 41 is composed of the same non-bonding amorphous fluororesin as the covering resin 40. In the following description, the non-bonding amorphous fluororesin constituting the covering resin 40 and the lens 41 included in the ultraviolet light-emitting device 1 according to the embodiment of the present invention will be referred to simply as "amorphous fluororesin" for the sake of simplification of description. In FIG. 3, although the covering resin 40 and the lens 41 are illustrated as different members and are distinguishable from each other, they may be integrated with each other and may not be distinguishable from each other.

Preferable as a structural unit having a fluorine-containing aliphatic cyclic structure is a unit based on a cyclic fluorine-containing monomer (hereinafter referred to as "unit A") or a unit formed by cyclopolymerization of diene fluorine-containing monomers (hereinafter referred to as "unit B"). The unit A and the unit B are described in detail in paragraphs [0031] to [0058] of WO 2014/178288 by the same applicant as the present application, and therefore, reference is made thereto.

As the cyclic polymerization method, homopolymerization method, and copolymerization method of the monomer, for example, a known method disclosed in Japanese Patent Laid-Open No. 4-189880 or the like can be applied. Amorphous fluororesin having a desired weight average molecular weight is obtained by methods such as adjusting the concentration of the monomer, adjusting the concentration of the initiator, and adding an additive transfer agent at the time of polymerization (cyclization polymerization, homopolymerization, copolymerization) of the monomer. In the following description, the weight average molecular weight of the polymer or copolymer constituting the amorphous fluororesin is simply described as the weight average molecular weight of the amorphous fluororesin.

Further, there is a possibility that the above-mentioned reactive terminal functional group or other unstable functional group is formed in the terminal functional group of the amorphous fluororesin after the polymerization treatment. Therefore, when a non-bonding amorphous fluororesin having a $CF_3$ terminal functional group is obtained, for example, a fluorine gas is contacted with the amorphous fluororesin after the polymerizing treatment by using a known method disclosed in Japanese Patent Laid-Open No. 11-152310 or the like, whereby the reactive terminal functional group or the unstable terminal functional group is replaced with $CF_3$ which is a non-reactive terminal functional group.

As an example of a commercial product of the non-bonding amorphous fluororesin, there is cited Cytop (manufactured by AGC Inc.). The Cytop in which the terminal functional group is $CF_3$ is a polymer of the above-mentioned units B represented by the following formula 1.

[Formula 1]

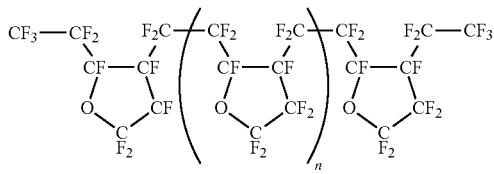

Manufacturing Method of Ultraviolet Light-Emitting Device

Next, a method for manufacturing an ultraviolet light-emitting device according to an embodiment of the present invention will be described.

First, the bare chip of the diced nitride semiconductor ultraviolet light-emitting element 10 is fixed on the first and second metal electrode wirings 32 and 33 of the submount 30 by known flip-chip mounting. Specifically, the p-electrode 14 and the first metal electrode wiring 32 are physically and electrically connected via the bonding material B1 such as AuSn solder or gold bumps, and the n-electrode 13 and the second metal electrode wiring 33 are physically and electrically connected via the bonding material B1.

Subsequently, a coating liquid in which the non-bonding amorphous fluororesin is dissolved in a fluorine-containing solvent, preferably an aprotic fluorine-containing solvent, is prepared.

Subsequently, the coating liquid prepared is injected onto the submount 30 and the nitride semiconductor ultraviolet light-emitting element 10 using a Teflon needle or the like having good peelability, and then the solvent is evaporated while gradually heating the coating solution to form a covering resin 40, which is a non-bonding amorphous fluororesin, in the upper surface and the side surfaces of the nitride semiconductor ultraviolet light-emitting element 10, the upper surface and the side surfaces of the submount 30 (the upper surface and the side surfaces of the first and second metal electrode wirings 32, 33, the surface of the base material 31 exposed between the first and second metal electrode wirings 32, 33), and the gap between the submount 30 and the nitride semiconductor ultraviolet light-emitting element 10. In the evaporation of the solvent, the solvent is evaporated by gradually heating from a low temperature range (for example, near room temperature) equal to or lower than the boiling point of the solvent to a high temperature range (for example, near 200° C.) equal to or higher than the boiling point of the solvent so that no bubbles remain in the covering resin 40.

Subsequently, the covering resin 40 is softened by heating in a temperature range of, for example, 150° C. to 300° C., more preferably 200° C. to 300° C., which is lower than or equal to a temperature (about 350° C.) at which decomposition of the non-bonding amorphous fluororesin starts, and the covering resin 40 on the upper surface of the nitride semiconductor ultraviolet light-emitting element 10 is pressed toward the nitride semiconductor ultraviolet light-emitting element 10 side.

Subsequently, the lens 41 made of the same non-bonding amorphous fluororesin as the covering resin 40 is formed on upper part of the covering resin 40 so as to cover the nitride semiconductor ultraviolet light-emitting element 10 by a well-known molding process such as compression molding, transfer molding, or the like. However, a process for densifying the amorphous fluororesin is performed simultaneously with or after the molding of the lens 41 of the amorphous fluororesin. As details will be described later in the description of densification of amorphous fluororesin, the refractive index of the amorphous fluororesin can be increased by increasing the density thereof, and a lens performance of the lens 41 can be enhanced.

Ultraviolet Light-Emitting Module

Figure 5:
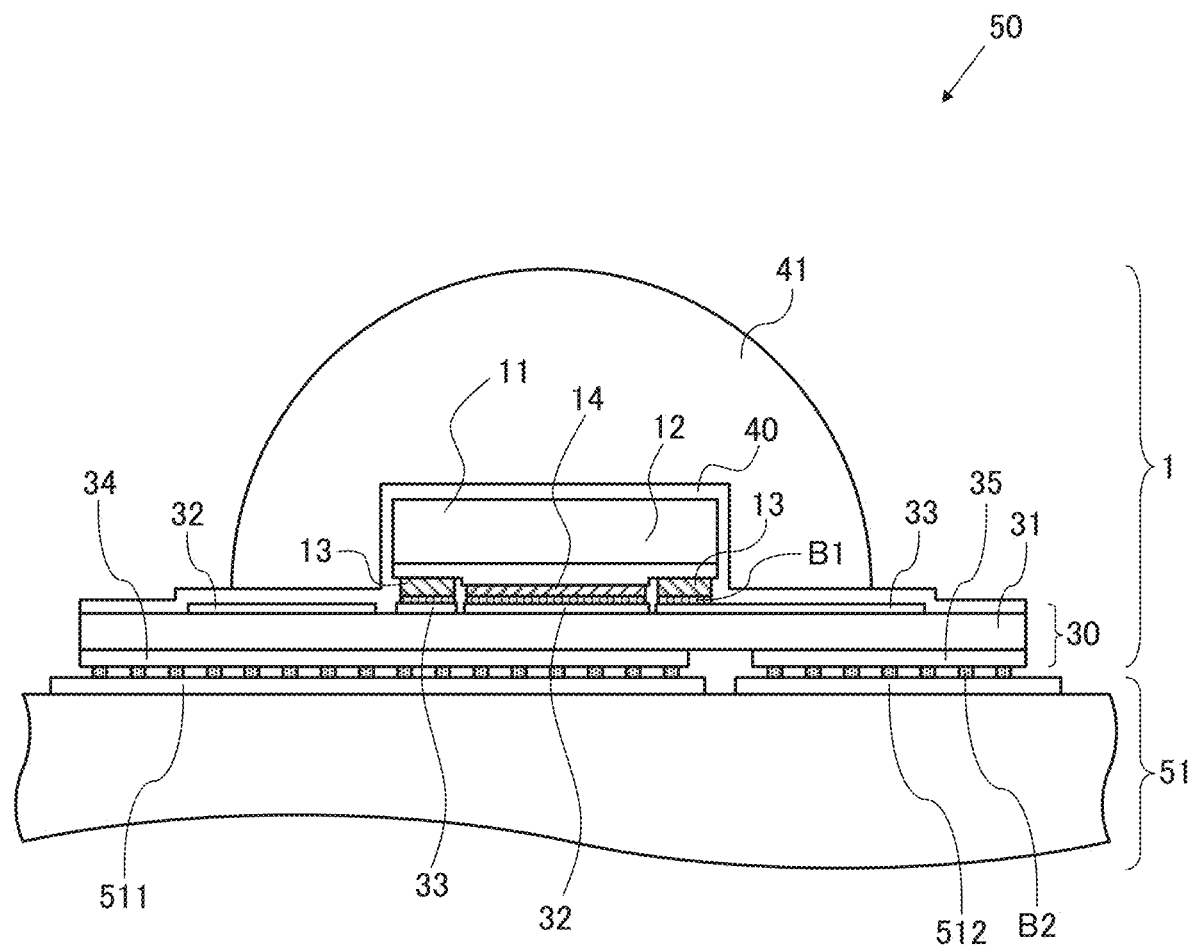
FIG. 5 is a cross-sectional view schematically showing an example of an ultraviolet light-emitting module according to an embodiment of the present disclosure.

Next, an example of the ultraviolet light-emitting module including ultraviolet light-emitting device 1 according to an embodiment of the present invention will be described referring to the drawings. FIG. 5 is a cross-sectional view schematically showing an example of ultraviolet light-emitting module according to an embodiment of the present invention.

As shown in FIG. 5, the ultraviolet light-emitting module (e.g., UV sterilizer) 50 includes the ultraviolet light-emitting device 1. For example, a land 511 in a mounting member 51 and a lead terminal 34 in the ultraviolet light-emitting device 1 are physically and electrically coupled, and a land 512 in the mounting member 51 and a lead terminal 35 in the ultraviolet light-emitting device 1 are physically and electrically coupled, via a bonding material B2 such as Au bumps.

At this time, when the lens 41 of amorphous fluororesin included in the ultraviolet light-emitting device 1 to be mounted is densified, the molecules are easily moved by exposure to a high temperature (e.g., a glass-transition temperature or higher), and the density may be lowered. Therefore, when the ultraviolet light-emitting device 1 provided with the lens 41 of the densified amorphous fluororesin is mounted on the mounting member 51, it is preferable to use a mounting method that can be carried out even at a low temperature (e.g., a temperature lower than the glass-transition temperature) such as bonding by ultrasonic vibrations, for example.

Densification of Amorphous Fluororesin

The densification of the amorphous fluororesin constituting lens 41 included in the nitride semiconductor ultraviolet light-emitting element 10 according to the embodiment of the present invention will be described below by referring to the drawings.

Figure 6:
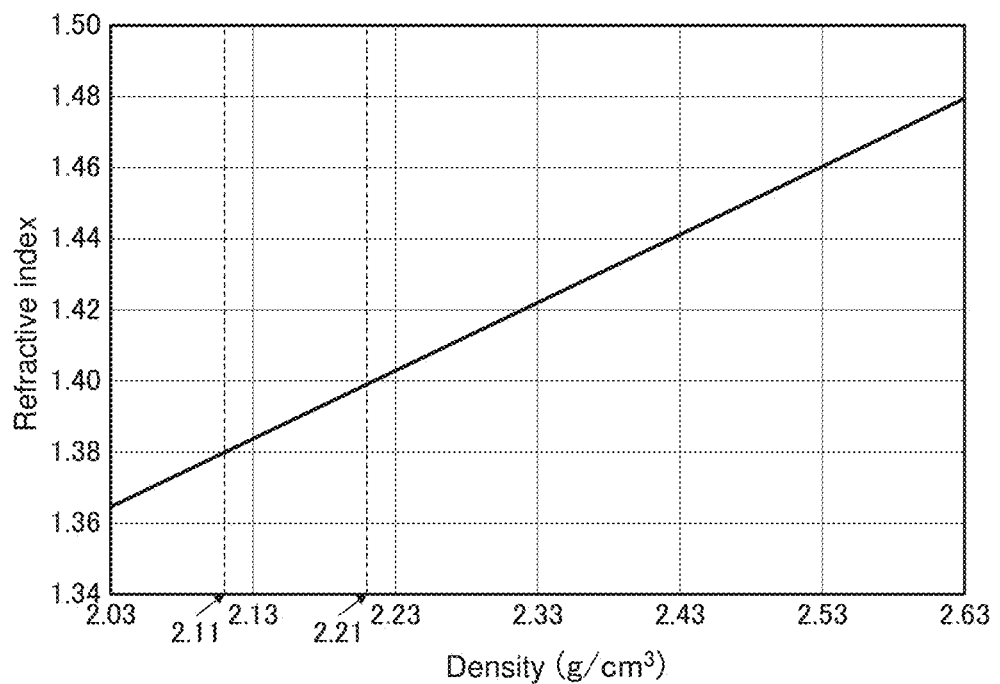
FIG. 6 is a diagram showing the relationship between a density and a refractive index of an amorphous fluororesin.

FIG. 6 is a diagram showing the relationship between a density and a refractive index of the amorphous fluororesin. In the graph shown in FIG. 6, the abscissa represents the density (g/cm$^3$), and the ordinate represents the refractive index with respect to UV light (wavelength: 265 nm).

The graph shown in FIG. 6 is obtained from the following equations (1) and (2). Equation (1) below is a Lorentz-Lawrence equation, where n is the refractive index, N is the number density, α is the polarizability, ρ is the density, M is the molecular weight, and [R] is the molecular refraction. In Equation (1), M is 278 and [R] is 28.12 for the D line (589.29 nm), each of which is known. By substituting these two values and an arbitrary value of the density ρ into Equation (1) below, the refractive index n of the D line of the amorphous fluororesin, which has the arbitrary density, is obtained.

$$\frac{n^2-1}{n^2+2} = \frac{N \cdot \alpha}{3} = \frac{\rho \cdot [R]}{M} \quad (1)$$

By substituting the refractive index of the D-line of the amorphous fluororesin, which has an arbitrary density calculated based on the above equation (1), into the following equation (2), the refractive index of the ultraviolet ray of amorphous fluororesin, which has the arbitrary density, can be calculated. In Equation (2) below, $n_{S,D}$ is the refractive index (1.333) of the D-ray of the amorphous fluororesin in standard condition, $n_{A,D}$ is the refractive index (1.365) of the D-ray of the amorphous fluororesin having the arbitrary density, $n_{S,UV}$ is the refractive index (1.365) of the ultraviolet ray of the amorphous fluororesin in standard condition, and $n_{A,UV}$ is the refractive index of the ultraviolet ray of the amorphous fluororesin having the arbitrary density. Note that the amorphous fluororesin in standard condition is an amorphous fluororesin whose density is not adjusted, and the density ρ at room temperature (23° C., hereinafter the same) is 2.030 g/cm$^3$. In the following, the refractive index of the ultraviolet ray of the amorphous fluororesin is simply referred to as "refractive index".

$$n_{A,UV} = n_{S,UV} \cdot \frac{n_{A,D}}{n_{S,D}} \quad (2)$$

As shown in FIG. 6, the refractive index of the amorphous fluororesin can be increased by increasing the density of the amorphous fluororesin. In particular, by making the density of the amorphous fluororesin larger than 2.11 g/cm$^3$, the refractive index can be made larger than the mean value 1.38 of the refractive index (1.365) of the amorphous fluororesin in standard condition and the refractive index (1.4) of the silicone resins (1.4). Therefore, the nitride semiconductor ultraviolet light-emitting element 10 can be sealed with the lens 41 made of the amorphous fluororesin having a refractive index closer to that of the silicone resin than that of the amorphous fluororesin in standard condition. That is, the nitride semiconductor ultraviolet light-emitting element 10 can be sealed with the lens 41 made of the amorphous fluororesin, in which the lens performance is closer to the silicone resins than the amorphous fluororesin in standard condition.

Further, by making the density of the amorphous fluororesin larger than 2.21 g/cm$^3$, the refractive index can be made larger than that of the silicone resin. Therefore, the nitride semiconductor ultraviolet light-emitting element 10 can be sealed with the lens 41 made of the amorphous fluororesin having a refractive index higher than that of the silicone resin. That is, the nitride semiconductor ultraviolet light-emitting element 10 can be sealed with the lens 41 made of the amorphous fluororesin having better lens performance than the silicone resin.

As described above, in the ultraviolet light-emitting device 1 according to the embodiment of the present invention, the nitride semiconductor ultraviolet light-emitting element 10 can be sealed with the lens 41 composed of the amorphous fluororesin whose lens performance is improved by making the refractive index larger than that of the amorphous fluororesin in standard condition.

Generally, a method of increasing the refractive index of a resin by changing the molecular structure such as adding a benzene ring or adding an inorganic material is known. However, when the nitride semiconductor ultraviolet light-emitting element 10 is sealed with an amorphous fluororesin, if the molecular structure of the amorphous fluororesin is changed, the absorption wavelength of light becomes longer and the absorption amount of ultraviolet light increases, so that the light extraction efficiency is lowered. In addition, in the amorphous fluororesin where the terminal functional group is a perfluoroalkyl group, since the affinity with an additive such as an inorganic material is low, the additive is not uniformly dispersed and the light transmittance is decreased, thereby decreasing the light extraction efficiency. In contrast to these methods, in the case of a method of increasing the refractive index by increasing the density, the molecular structure is not changed and an additive is not used, so that it is possible to prevent a decrease in the light extraction efficiency. Therefore, by sealing the nitride semiconductor ultraviolet light-emitting element 10 with the lens 41 made of the amorphous fluororesin whose refractive index is increased by increasing the density, it is possible to improve the lens performance while suppressing a decrease in the light extraction efficiency.

One method of densifying the amorphous fluororesin includes, for example, pressurizing the amorphous fluororesin simultaneously with or after molding the lens 41. Specifically, the amorphous fluororesin is pressurized while being heated to a glass-transition temperature (108° C.) or higher to be densified, and then cooled to a temperature lower than the glass-transition temperature by 30° C. or more, while being pressurized, thereby immobilizing the densified state.

Figure 7:
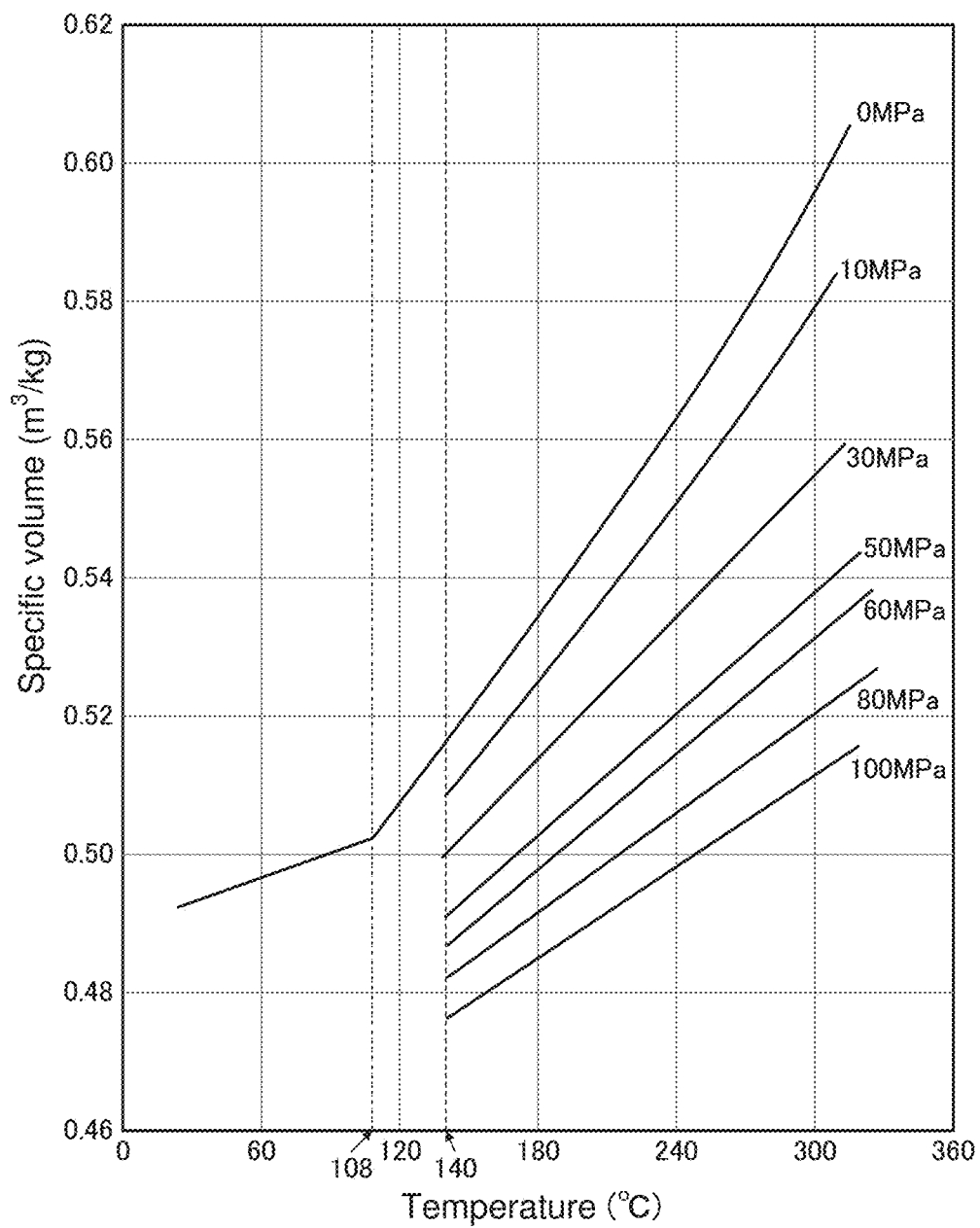
FIG. 7 is a graph showing the relationship between a temperature and a specific volume when the pressure of 0 MPa to 100 MPa is applied to an amorphous fluororesin.
Figure 8:
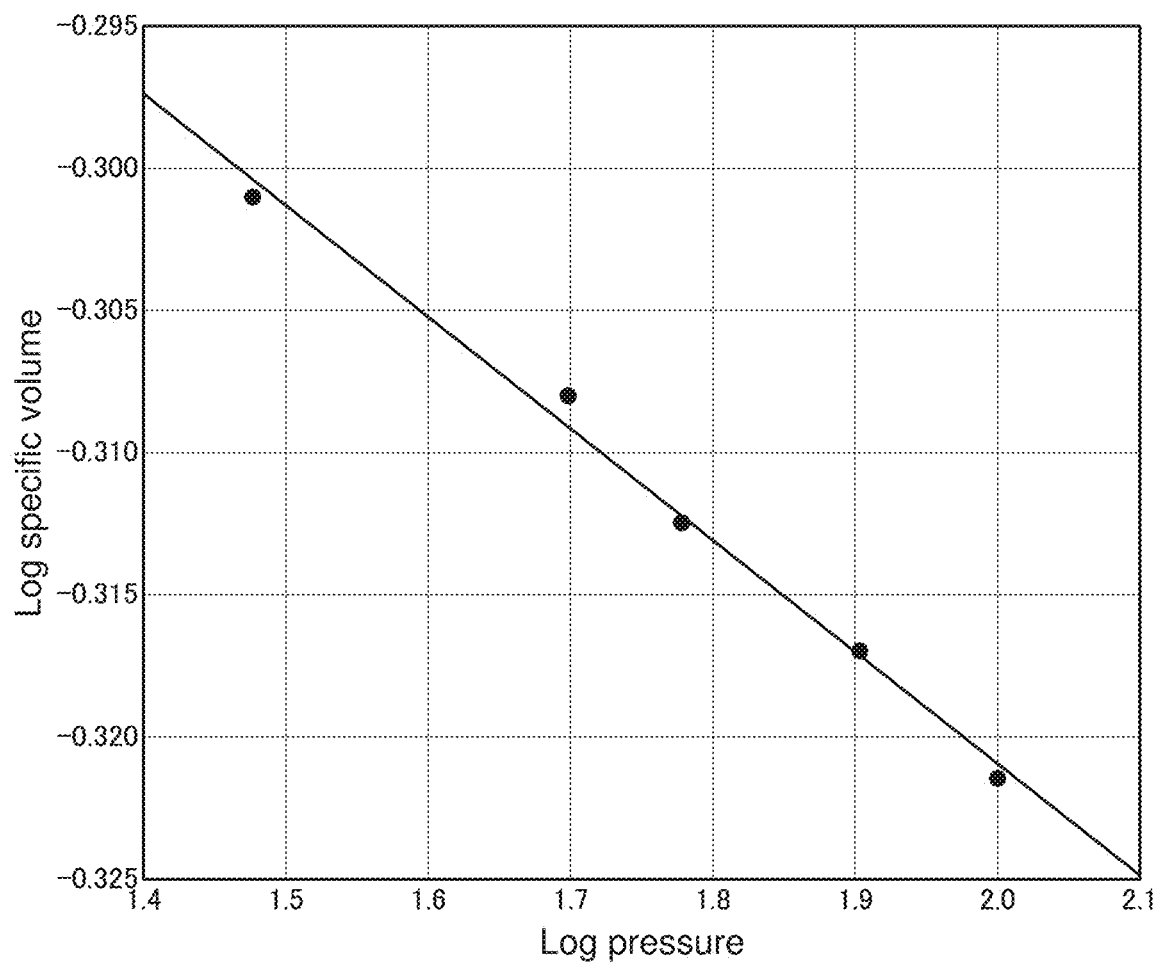
FIG. 8 is a graph showing the relationship between log pressure and log specific volume at 140° C.
Figure 9:
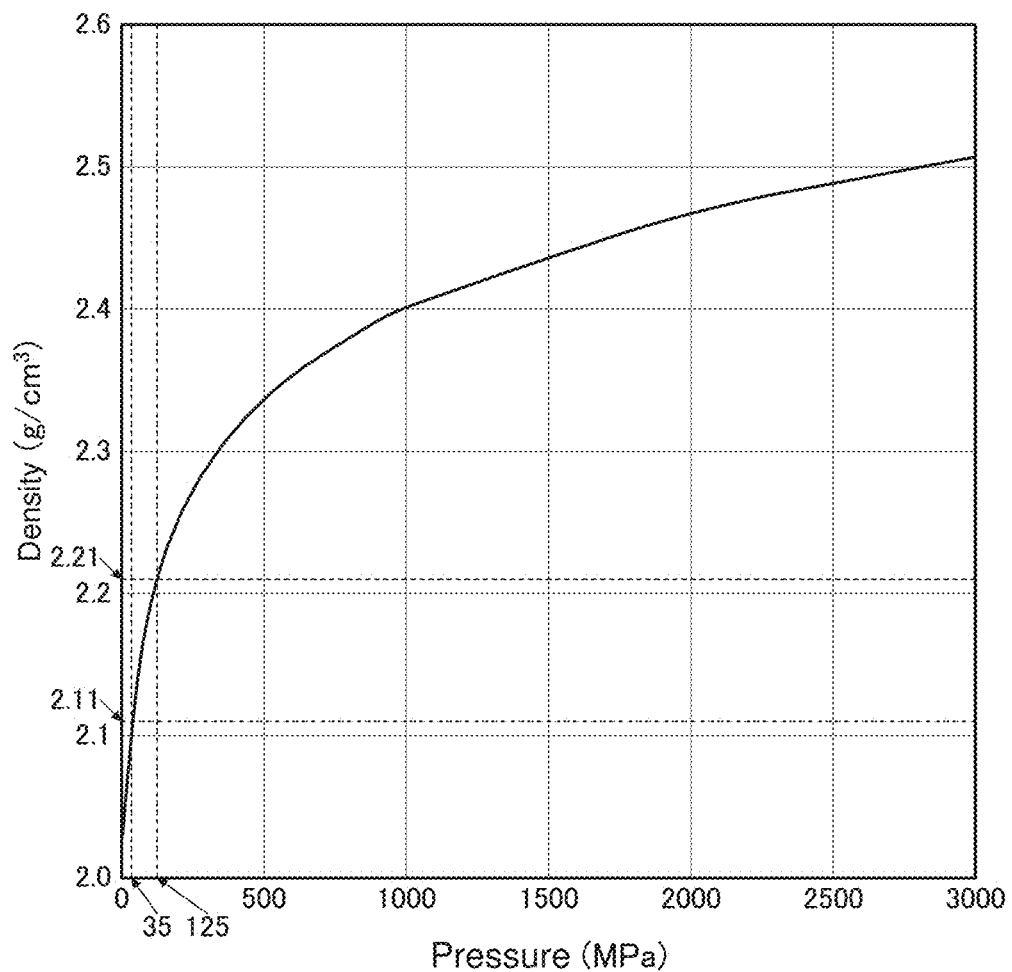
FIG. 9 is a graph showing the relationship between pressure and density of the amorphous fluororesin at a room temperature.

The densification of the amorphous fluororesin in the above-described method will be explained by referring to the drawings. FIG. 7 is a graph showing the relationship between a temperature and a specific volume when a pressure of 0 MPa to 100 MPa (gauge pressure, hereinafter the same) is applied to the amorphous fluororesin. FIG. 8 is a graph showing the relationship between log pressure and log specific volume at 140° C. FIG. 9 is a graph showing the relationship between pressure and density of the amorphous fluororesin at a room temperature. In the graphs shown in FIG. 7, the abscissa represents a temperature (° C.) and the ordinate represents a specific volume (m³ per kilogram). In the graph shown in FIG. 8, the abscissa represents log pressure, and the ordinate represents log specific volume. In the graphs shown in FIG. 9, the abscissas represents a pressure (MPa) applied to the amorphous fluororesin from a temperature equal to or higher than the glass-transition temperature to a temperature lower than the glass-transition temperature by 30° C. or more, and the ordinate represents a density (g/cm³) at a room temperature.

As shown in FIG. 7, at a temperature equal to or higher than the glass-transition temperature (108° C.), as the pressure applied to the amorphous fluororesin increases, the specific volume decreases (the density increases). Here, in FIG. 7, by reading the pressure and the specific volume at a specific temperature, the relationship between the pressure and the specific volume at the specific temperature can be obtained. The graph shown in FIG. 8 shows the relationship between the pressure and the specific volume at 140° C. in FIG. 7, and shows the relationship between the pressure of 30 MPa to 100 MPa and the specific volume.

The approximate straight line shown in FIG. 8 is obtained by linearly approximating the respective normal logarithmic values of the pressure and the specific volume of 30 MPa to 100 MPa at 140° C. in FIG. 7. This approximate straight line is expressed by the following equation (3) where X is the log pressure and Y is the log specific volume. Since the contribution rate R2 of this approximate straight line is 0.99, it can be said that the log pressure and the log specific volume have very strong linear correlations.

$$Y = -0.0395 \cdot X - 0.24247 \quad (3)$$

The above equation (3) represents the relationship between the log pressure and the log specific volume at 140° C. Therefore, in order to calculate the density at room temperature of the amorphous fluororesin in which the densified condition is fixed by being cooled from a temperature equal to or higher than the glass-transition temperature to a temperature lower than the glass-transition temperature by 30° C. or more while applying a pressure, for example, the following equation (4) is calculated. In the following formula (4), $v_{140,0}$ is a specific volume (0.516 m³/kg) in the case of applying a pressure of 0 MPa to the amorphous fluororesin at 140° C., $v_{140,A}$ is a specific volume in the case of applying an arbitrary pressure to the amorphous fluororesin at 140° C., $\rho_{R,0}$ is the density (2.030 g/cm³) at room temperature of the amorphous fluororesin cooled from 140° C. to a temperature lower than the glass-transition temperature by 30° C. or more, while applying a pressure of 0 MPa, $\rho_{R,A}$ is the density at a room temperature of the amorphous fluororesin in which the densified state is immobilized by cooling from 140° C. to a temperature lower than the glass-transition temperature by 30° C. or more, while applying the arbitrary pressure.

$$\rho_{R,A} = \rho_{R,0} \cdot \frac{v_{140,0}}{v_{140,A}} \quad (4)$$

The graph shown in FIG. 9 is calculated based on the above equations (3) and (4). The temperature for calculating the rate of change of the specific volume is not limited to 140° C. as long as it is equal to or higher than the glass-transition temperature.

As shown in FIG. 9, 2.11 g/cm³, which is a refractive index of the amorphous fluororesin required to obtain a refractive index closer to that of the silicone resin than that of the amorphous fluororesin in standard condition, can be achieved by applying a pressure of 35 MPa or more. Further, 2.21 g/cm³, which is a refractive index of the amorphous fluororesin required to obtain a refractive index greater than that of the silicone resin, can be achieved by applying a pressure of 125 MPa.

Figure 10A:
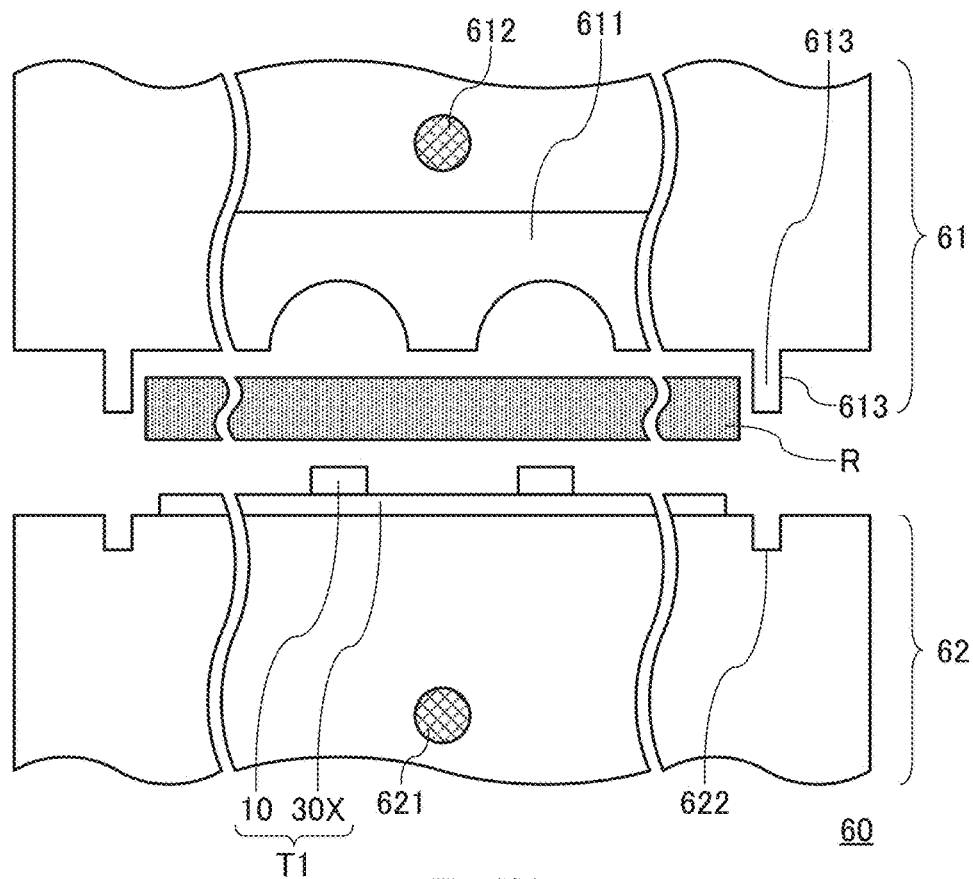
FIGS. 10A and 10B are a cross-sectional view schematically showing an example of a densification device.
Figure 10B:
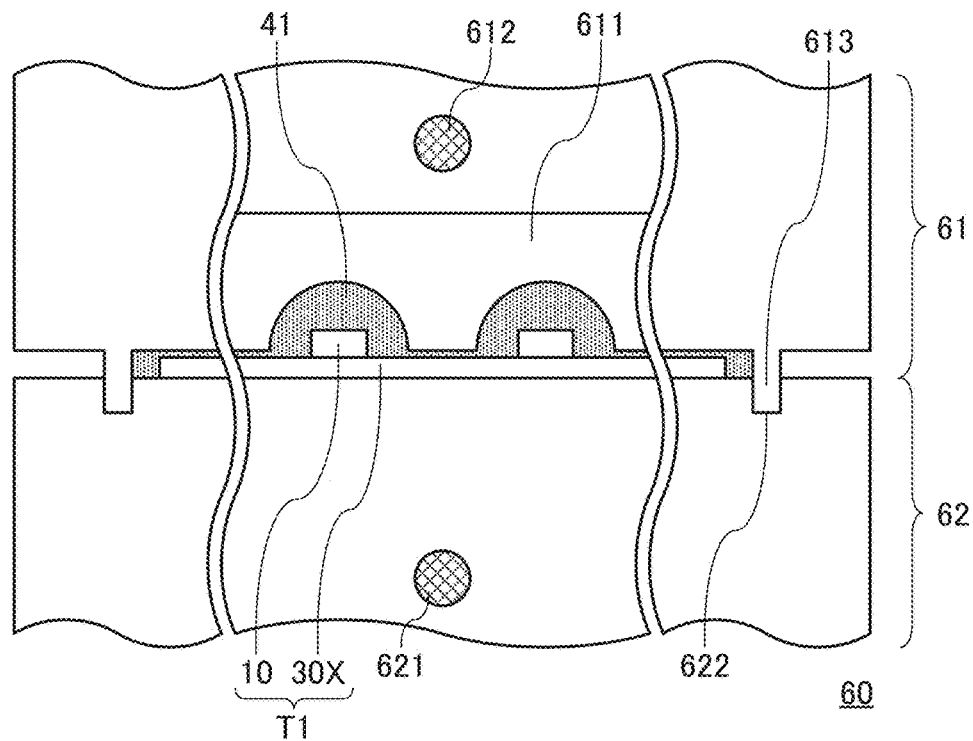

Next, a specific embodiment of a densification device for realizing the high density of the above-mentioned amorphous fluororesin will be described referring to the drawings. FIG. 10 is a cross-sectional view schematically showing an example of the densification device. The densification device 60 illustrated in FIGS. 10A and 10B is a device for densifying the amorphous fluororesin simultaneously with the molding of the lens 41, and FIG. 10A shows a state prior to the molding of the lens 41, and FIG. 10B shows a state during the molding of the lens 41. In the following explanation referring to FIGS. 10A and 10B, the configuration of the ultraviolet light-emitting device 1 is simplified, and only the base plate 30X in which the nitride semiconductor ultraviolet light-emitting element 10, the lens 41, and a plurality of bases are integrated is illustrated and explained. In FIGS. 10A and 10B and the following explanation referring to FIGS. 10A and 10B, the combinations of a plurality of the nitride semiconductor ultraviolet light-emitting elements 10 and the base plate 30X on which the plurality of the nitride semiconductor ultraviolet light-emitting elements 10 are flip-chip mounted are referred to as "target T1".

The densification device 60 shown in FIGS. 10A and 10B is a compression-molding machine for sandwiching the amorphous fluororesin R from above and below in the drawing. The densification device 60 includes an upper part 61 which is driven vertically in FIGS. 10A and 10B, and a lower part 62 which holds target T1 on its upper surface. Although the drive mechanism for driving the upper part 61 is not shown in FIGS. 10A and 10B, a well-known drive mechanism of a compression-molding machine can be applied. The densification device 60 shown in FIGS. 10A and 10B is a device capable of simultaneously molding and densifying a plurality of lens 41 for sealing each of a plurality of the nitride semiconductor ultraviolet light-emitting elements 10.

The upper part 61 includes a lens mold 611 which is a mold for forming the sheet-like amorphous fluororesin R into the shape of lens 41, a heater 612 for heating the amorphous fluororesin R at the time of molding, and a convex part 613 for preventing leakage of the amorphous fluororesin R at the time of molding. The lower part 62 also comprises a heater 621 for heating the amorphous fluororesin R during molding, and a recessed part 622 which mates with convex part 613 of the upper part 61 during molding.

As described above, the high-density amorphous fluororesin is obtained by applying pressure thereto while being heated to a glass-transition temperature or higher to be densified, and then cooling it to a temperature lower than the glass-transition temperature by 30° C. or more while being pressurized. In the densification device 60, when the sheet-like amorphous fluororesin R is compression-molded into the shape of lens 41 as shown in FIG. 10B, the weight (volume) of the amorphous fluororesin is measured so that a desired pressure is applied to the lens 41, and heaters 62 and 63 are controlled so that the temperature of the lens 41 becomes equal to or higher than the glass-transition temperature (for example, 140° C.). After the forming is completed while maintaining the temperature for at least several minutes (e.g., 5 minutes or more), the lens 41 is kept pressurized while maintaining the state shown in FIG. 10B until the temperature of the amorphous fluororesin becomes a temperature lower than the glass-transition temperature by 30° C. or more (e.g., 80° C. or less). Thereafter, the base plate 30X is divided so as to include at least one nitride semiconductor ultraviolet light-emitting element 10 sealed by the lens 41 made of a high-density amorphous fluororesin, whereby a plurality of the ultraviolet light-emitting devices 1 are obtained.

By using the densification device 60 shown in FIGS. 10A and 10B, the lens 41 included in each of the plurality of the ultraviolet light-emitting devices 1 can be formed and densified at the same time, so that the ultraviolet light-emitting device 1 can be efficiently manufactured.

Figure 11:
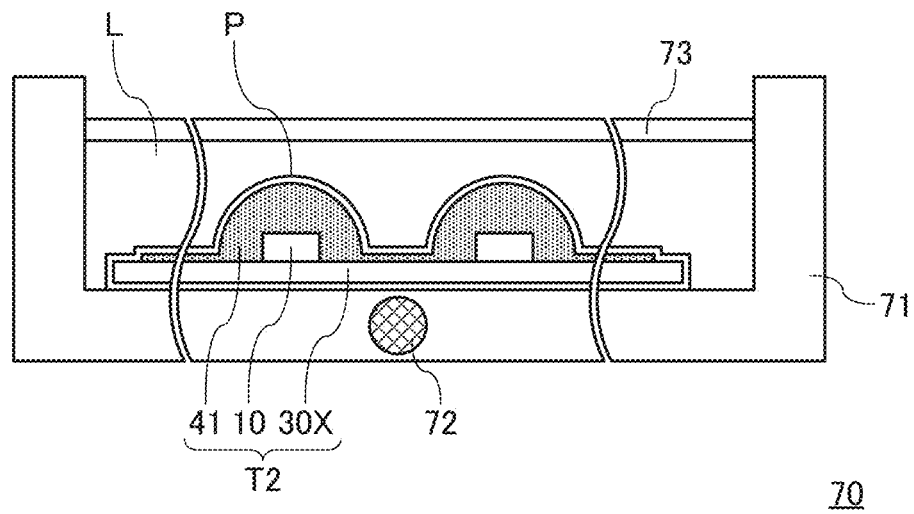
FIG. 11 is a cross-sectional view schematically showing another example of a densification device.

Although the densification device 60 shown in FIGS. 10A and 10B densities the amorphous fluororesin at the same time as the molding of the lens 41, the amorphous fluororesin may be densified after the molding of lens 41. Referring now to the drawings, a densification device of densifying the lens 41 after forming will be described. FIG. 11 is a cross-sectional view schematically showing another embodiment of a densification device. In FIG. 11 and the following explanation referring to FIG. 11, only the nitride semiconductor ultraviolet light-emitting element 10, the lens 41, and the base plate 30X will be illustrated and explained by simplifying the configuration of the ultraviolet light-emitting device 1. In FIG. 11 and the following explanation referring to FIG. 11, the combinations of the plurality of the nitride semiconductor ultraviolet light-emitting elements 10, the base plate 30X on which the plurality of the nitride semiconductor ultraviolet light-emitting elements 10 are flip-chip mounted, and the lens 41 for sealing each of the plurality of the nitride semiconductor ultraviolet light-emitting elements 10 are referred to as "target T2".

As shown in FIG. 11, a densification device 70 comprises: a housing 71 that accommodates target T2 inside; a heater 72 that heats the lens 41 when densifying; and a pressing plate 73 that presses the lens 41 by driving the fluid L that fills the inside of the housing 71 downward in the drawing. Although a drive mechanism for driving the pressing plate 73 is not shown in FIG. 11, a well-known drive mechanism of a press machine can be applied. The densification device 70 shown in FIG. 11 is a device capable of densifying a plurality of the lenses 41 for sealing a plurality of the nitride semiconductor ultraviolet light-emitting elements 10 at the same time.

Target T2 is sealed with a pack P so as not to come into direct contact with the liquid L. The liquid L is, for example, an organic solvent or a mechanical oil, and the pack P is composed of a flexible material such as rubbers (a material capable of transmitting pressures applied to the liquid L to the lens 41). When a liquid L (e.g., an organic solvent) which can be directly contacted with target T is used, the pack P may not be used.

The densification device 70 shown in FIG. 11 presses down pressing the plate 73 to apply pressure to lens 41 via the liquid L, and controls heater 72 so that the temperature of lens 41 is equal to or higher than the glass-transition temperature (e.g., 140° C.). Then, after the densification is completed by maintaining it for at least several minutes (for example, 5 minutes or more), the lens 41 is kept pressurized while maintaining the condition shown in FIG. 11 until the temperature of the amorphous fluororesin becomes lower than the glass-transition temperature by 30° C. or more (e.g., 80° C. or less). Thereafter, the base plate 30X is divided so as to include at least one nitride semiconductor ultraviolet light-emitting element 10 sealed by the lens 41 made of a high-density amorphous fluororesin, whereby a plurality of the ultraviolet light-emitting devices 1 are obtained.

By using the densification device 70 shown in FIG. 11, the lens 41 included in each of the plurality of ultraviolet light-emitting devices 1 can be densified at the same time, so that the ultraviolet light-emitting device 1 can be efficiently manufactured.

Modifications, Etc

In FIG. 10, although the densification device 60 simultaneously forms and densifies a plurality of lenses 41 included in each of the plurality of ultraviolet light-emitting devices 1, only lenses 41 included in one ultraviolet light-emitting device 1 may be formed and densified. Similarly, although FIG. 11 illustrates an example in which the densification device 70 densifies a plurality of lenses 41 included in each of the plurality of the ultraviolet light-emitting devices 1 at the same time, only lenses 41 included in one ultraviolet light-emitting device 1 may be densified.

In FIG. 10, the densification device 60 forms and densifies the lens 41 by compression molding, but the lens 41 may be formed and densified by other molding methods such as transfer molding.

In FIGS. 3, 5, 10B and 11, although the lens 41 is exemplified to be hemispherical, the shape of the lens is not limited to the hemispherical shape. For example, when the lens is used to focus light, a part of the surface of the lens may be a spherical surface or a convex curved surface (aspherical surface), and another part of the surface of the lens may be a flat surface or a curved surface close to a flat surface. Specifically, for example, in the ultraviolet light-emitting device 1 according to the embodiment of the present invention, in order to densify the amorphous fluororesin constituting the lens 41, a pressure is applied to the lens 41 at the time of forming the lens or thereafter. However, the top surface of the lens may become a flat surface or a curved surface close to a flat surface according to the pressure being applied.

In the embodiment described above, the amorphous fluororesin constituting the lens 41 is densified at the time of forming lens 41 or thereafter in the ultraviolet light-emitting device 1, but the amorphous fluororesin may be densified after the ultraviolet light-emitting device 1 is mounted on the mounting member 51 (see FIG. 5). In this instance, for example, the mounting member 51 may be removed from the the ultraviolet light-emitting module 50 and the amorphous fluororesin constituting the lens 41 may be densified by using the densification device 70 as shown in FIG. 11.

As described above, when the amorphous fluororesin constituting the lens 41 is densified after the ultraviolet light-emitting device 1 is mounted, a high-temperature process (a process at a temperature equal to or higher than the glass-transition temperature of the amorphous fluororesin and at which the glass-transition temperature is restored if the amorphous fluororesin is densified) can be performed until the ultraviolet light-emitting device 1 has been mounted. For example, solder reflow can be performed when the ultraviolet light-emitting device is mounted.

INDUSTRIAL APPLICABILITY

The ultraviolet light-emitting device according to the present invention can be used for an ultraviolet light-emitting device including a nitride semiconductor ultraviolet light-emitting element flip-chip mounted on a base, and in particular, can be used for an ultraviolet light-emitting device including a nitride semiconductor ultraviolet light-emitting element that emits light having an emission center wavelength of 200 nm or more and 365 nm or less (ultraviolet light).

DESCRIPTION OF SYMBOLS

1: Ultraviolet light-emitting device
10: Nitride semiconductor ultraviolet light-emitting element
11: Sapphire substrate
12: Semiconductor laminated portion
13: n-electrode
14: p-electrode
20: AlN layer
21: AlGaN layer
22: n-type cladding layer (n-type AlGaN)
23: Active layer
24: Electron blocking layer (p-type AlGaN)
25: p-type cladding layer (p-type AlGaN)
26: p-type contact layer (p-type GaN)
30: Submount (base)
30X: Base plate
31: Substrate
32: First metal electrode wiring
320: First electrode pad
321: First wiring part
33: Second metal electrode wiring
330: Second electrode pad
331: Second wiring part
34, 35: Lead terminal
40: Covering resin
41: Lens
50: Ultraviolet light-emitting module
51: Mounting member
511, 512: Land
60: Densification device
61: Upper part
611: Lens mold
612, 621: Heater
613: Convex part
62: Lower part
622: Recessed part
70: Densification device
71: Housing
72: Heater
73: Pressing plate
B1, B2: Bonding material
T1, T2: Target

The invention claimed is:

1. An ultraviolet light-emitting device comprising:
a base; a nitride semiconductor ultraviolet light-emitting element flip-chip mounted on the base; and a lens that seals the nitride semiconductor ultraviolet light-emitting element and focuses or diffuses light emitted from the nitride semiconductor ultraviolet light-emitting device,
wherein the lens is composed of an amorphous fluororesin in which a structural unit of a polymer or copolymer has a fluorine-containing aliphatic cyclic structure and a terminal functional group is a perfluoroalkyl group, and a density of the amorphous fluororesin is larger than 2.11 g/cm$^3$.

2. The ultraviolet light-emitting device according to claim 1, wherein the density of amorphous fluororesin constituting the lens is greater than 2.21 g/cm$^3$.

3. The ultraviolet light-emitting device according to claim 1, wherein a part of a surface of the lens may be a spherical surface or a convex curved surface.

4. The ultraviolet light-emitting device according to claim 1, wherein the emission center wavelength of the nitride semiconductor ultraviolet light-emitting element is 200 nm or more and 365 nm or less.

5. A method for manufacturing an ultraviolet light-emitting device, the method comprising: a first step of sealing a nitride semiconductor ultraviolet light-emitting element flip-chip mounted on a base to form a lens for focusing or diffusing light emitted from the nitride semiconductor ultraviolet light-emitting element;
wherein the lens is formed of an amorphous fluororesin in which a structural unit of a polymer or copolymer has a fluorine-containing aliphatic cyclic structure and a terminal functional group is a perfluoroalkyl group; and,
in the first step or a subsequent step, the amorphous fluororesin constituting the lens is heated to a glass transition temperature or higher, a pressure of 35 MPa or higher is applied to the amorphous fluororesin, and the lens is cooled to a temperature lower than the glass-transition temperature by 30° C. or more while the pressure is applied, thereby densifying the amorphous fluororesin.

6. The method for manufacturing an ultraviolet light-emitting device according to claim 5, the method further comprising:
simultaneously forming the lens for sealing each of a plurality of nitride semiconductor ultraviolet light-emitting elements flip-chip mounted on a base plate in which a plurality of bases are integrated in the first step; and
a second step of dividing the base plate so that one or more of the nitride semiconductor ultraviolet light-emitting element sealed by the lens are included after densifying the amorphous fluororesin constituting the lens.

7. A method for manufacturing an ultraviolet light-emitting module, the method comprising:
a third step of mounting one or more of ultraviolet light-emitting device having a nitride semiconductor ultraviolet light-emitting element flip-chip mounted on a base and sealed by a lens on a mounting member; and
a fourth step of densifying the amorphous fluororesin after the third step,
wherein the lens is formed of an amorphous fluororesin in which a structural unit of a polymer or copolymer has a fluorine-containing aliphatic cyclic structure and a terminal functional group is a perfluoroalkyl group; and
in the fourth step, the amorphous fluororesin constituting the lens is heated to a glass-transition temperature or higher, a pressure of 35 MPa or higher is applied to the amorphous fluororesin, and the lens is cooled to a temperature lower than the glass-transition temperature by 30° C. or more while the pressure is applied.

* * * * *